United States Patent [19]
Barel et al.

[11] Patent Number: 5,740,180
[45] Date of Patent: Apr. 14, 1998

[54] CIRCUIT AND TEST METHOD FOR TESTING INPUT CELLS

[75] Inventors: Udi Barel, Rishon Le Zion; Boaz Shahar, Givataim; Ido Reuveny, Rishon Le Zion, all of Israel

[73] Assignee: Motorola, Inc., Schaumburg, Ill.

[21] Appl. No.: 801,451

[22] Filed: Feb. 18, 1997

[51] Int. Cl.$^6$ .................................................. G01R 31/28
[52] U.S. Cl. ....................... 371/22.1; 371/22.2; 371/22.31
[58] Field of Search .................................. 371/22.1, 22.2, 371/22.31, 22.32, 22.34; 324/151.8, 73 R; 365/201

[56] References Cited

U.S. PATENT DOCUMENTS

| | | | |
|---|---|---|---|
| 4,875,003 | 10/1989 | Burke | 324/73 R |
| 4,912,709 | 3/1990 | Teske et al. | 371/22.1 |
| 5,132,937 | 7/1992 | Tuda et al. | 365/201 |
| 5,345,423 | 9/1994 | Koh et al. | 365/201 |
| 5,351,213 | 9/1994 | Nakashima | 365/201 |

*Primary Examiner*—Hoa T. Nguyen
*Attorney, Agent, or Firm*—Rennie William Dover; Robert M. Handy

[57] ABSTRACT

A circuit (100) comprises a built-in test circuit (150) which verifies the proper operation of input cells (130) when they receive signals at a first level (71) and at a second level (72). The test circuit (160) comprises a first and a second logic (110, 120) which receive power only when a test is performed. Thereby power consumption of the test circuit (160) is reduced. The first and the second logic (110, 120) are conveniently formed by a combination of parallel coupled transistors acting in an logical OR-function.

17 Claims, 4 Drawing Sheets

CIRCUIT AND TEST METHOD FOR TESTING INPUT CELLS

FIELD OF THE INVENTION

This invention relates in general to integrated circuits, especially to circuits having built-in test circuitry and to a method for testing.

BACKGROUND OF THE INVENTION

Testing of integrated circuits during manufacturing contributes significantly to the costs of such circuits. Tests ensure that only defect-free circuits are shipped. Tests are performed on every circuit (routine tests) or on selected circuits (sample tests). For example, in a typical routine test, input cells of circuits are tested. The test result is positive (PASSED) when all input cells of a circuit read input signals at standardized levels and provide correct intermediate signals. The test result is negative (FAILED) when at least one input cell does not provide a correct intermediate signal. It is often not required to determine which input cell is defective.

Families of integrated circuits (e.g. CMOS, TTL, ECL), are characterized among other things by standardized levels of input and output signals. Compatibility of signal levels among different families is often required and routinely tested. Devices belonging to a first family (e.g., CMOS devices) accommodate signals from devices of a second family (e.g., TTL devices) and vice versa. For example, CMOS devices properly read input signals originating from TTL devices.

There are many testing methods known in the art, such as boundary scan methods, built-in self tests, and others. Depending on the complexity of the required tests, there are testing costs related to additional silicon, to the testing time, to test equipment or to other factors. This invention seeks to provide a test arrangement and a test method which mitigates or avoids the above mentioned and other disadvantages.

BRIEF DESCRIPTION OF THE DRAWINGS

FIGS. 4–6 are simplified circuit diagrams of the circuit of FIG. 2 in a preferred embodiment of the invention, wherein

DETAILED DESCRIPTION OF A PREFERRED EMBODIMENT

Figure 1:
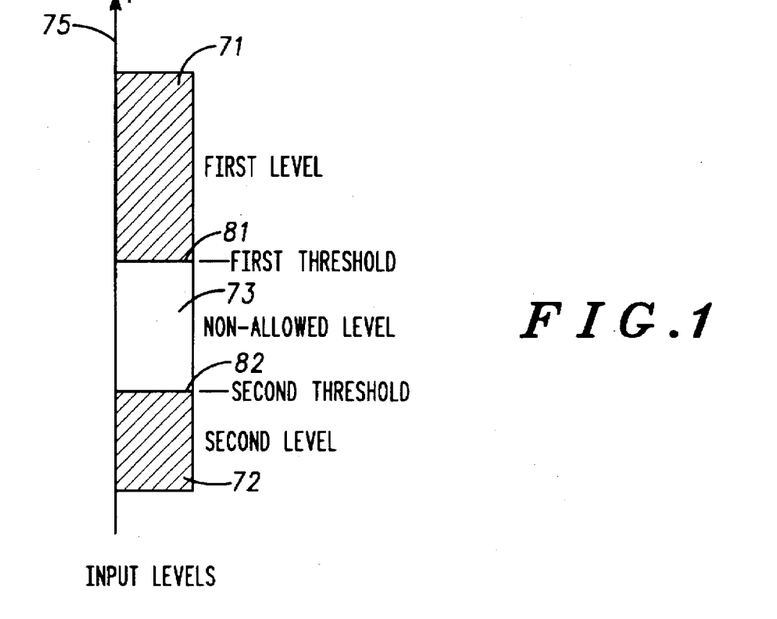
FIG. 1 is a simplified signal level diagram defining signal levels.

FIG. 1 is a simplified signal level diagram for defining signal levels. Voltage V is given vertically on line 75. Levels are indicated by areas to the right of line 75. Allowed levels are first level 71 and second level 72 (section lines) which represent logical states (e.g., "1" and "0"). At non-allowed third level 73, the representation of logical states is not definite. Circuits should properly recognize signals at first level 71 as, for example, logical "1" and second level 72 as, for example, logical "0". First threshold 81 belongs to first level 71 and second threshold 82 belongs to second level 72. Thresholds 81 and 82 are located at the edges of non-allowed third level 73. Assuming a voltage V increasing in the arrow direction, first threshold 81 is the minimum voltage of first level 71 and second threshold 82 the maximum voltage of second level 72. For example and not intended to be limiting, the test method according to the present invention can verify that CMOS circuits correctly read input signals at TTL levels of 2.0 volts (threshold 81, "1") and 0.8 volts (threshold 82, "0").

Figure 2:
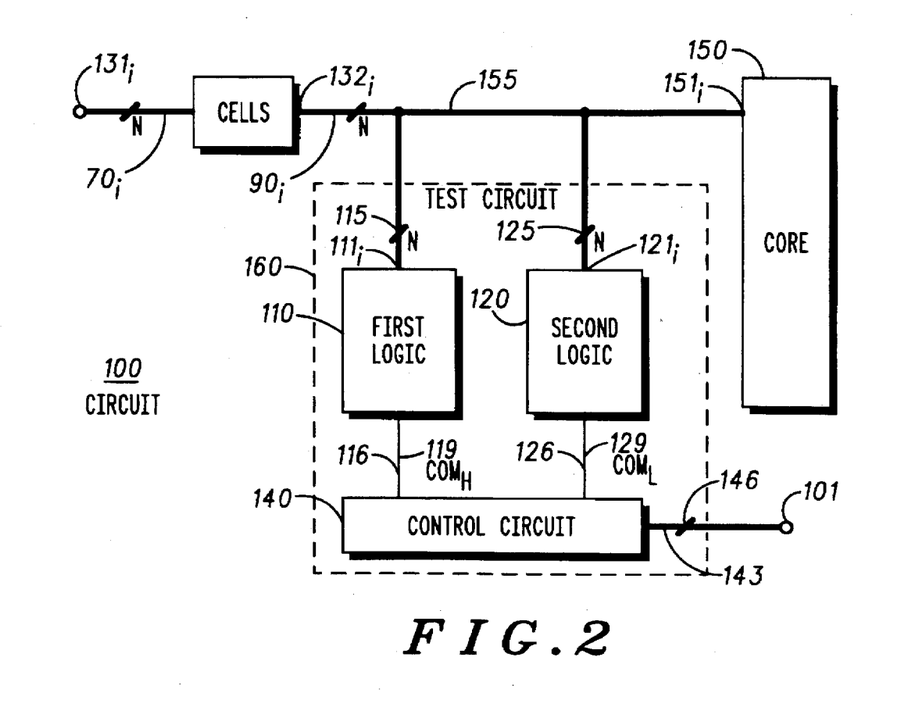
FIG. 2 is a simplified block diagram of a circuit according to the invention.

FIG. 2 is a simplified block diagram of circuit 100 according to the present invention. In the figures and in the description, a plurality of N elements and signals is indicated by indices i from 1 to N. In FIG. 2, reference numbers 70, 90, 130, 131, 132, 111, 121, and 151 have indices 'i' that refer to the plurality of N. Busses 115, 125, and 155 carrying a plurality of N signals and bus 146 (4 bits) are shown bolder than single-bit lines 116 and 126.

Circuit 100 comprises a plurality of N input cells $130_i$ (hereinafter cells $130_i$), test circuit 160 (dashed frame) and core 150. Test circuit 160 and core 150 are independent; core 150 is not essential for the invention. Therefore, the invention is not limited to circuits having a special function. Circuit 100 can be any integrated circuit, such as for example, a signal processing circuit, a logic element, a microprocessor or any other circuit having a plurality of inputs.

Cells $130_i$ have inputs $131_i$ for receiving first signals $70_i$ (hereinafter $In_i$) and have outputs $132_i$ for providing second signals $90_i$ (hereinafter $S_i$). Although cells $130_i$ are illustrated here as input elements, the term 'cell' is indented to include other circuitry, which provides second signals $S_i$. A person of skill in the art will be able to apply the present invention to other circuits having internal signal paths which can be considered as outputs $132_i$. First signals $In_i$ have logical states represented by first level 71 and second level 72; second signals $S_i$ have logical states represented by other levels which can be identical to levels 71 and 72 or different. Properly operating cells $130_i$ correctly transfer first signals $In_i$ to second signals $S_i$ without changing the information (e.g., logically, $S_i=In_i$). This transfer can comprise an inversion (e.g., $S_i=NEG(In_i)$), but the information as such remains unchanged. Outputs $132_i$ of cells $130_i$ are coupled to inputs $151_i$ of core 150 via bus 155.

Test circuit 160 determines whether cells $130_i$ are functioning or not. In other words, test circuit 160 detects the presence of improperly operating cells $130_i$. Or, test circuit 160 detects that all cells $130_i$ transfer first signals $In_i$ correctly to second signals $S_i$. In the following, indices k, x, and y are used for malfunctioning cells $130_k$, $130_x$, $130_y$. Test circuit 160 comprises first logic 110, second logic 120, and control circuit 140. Circuit 100 has control interface 101 coupled to control circuit 140 (via bus 146). Outputs $132_i$ of cells $130_i$ are coupled to inputs $111_i$ of first logic 110 via bus 115 and to inputs $121_i$ of second logic 120 via bus 125. First logic 110 is coupled to control circuit 140 by first line 116. Second logic 120 is coupled to control circuit 140 by second line 126. Signals which are supplied to or provided by control circuit 140 to or from control interface 101 are collectively referred to a third control signal 143. At lines 116 and 126, control circuit 140 provides first control signal 119 (hereinafter ComH), and second control signal 129 (hereinafter ComL), respectively. Preferably, ComH and ComL are binary or tristate signals. First logic 110 and second logic 120 receive the plurality of N second signals $S_i$. In first logic 110 and in second logic 120, second signals $S_i$ are related by logical functions (e.g., "OR"). The result of the logical function is sent to control circuit 140 by modifying signals ComH and ComL. The phrase 'modify' is intended to express that first logic 110 and second logic 120 alternate the logical states of ComH and ComL, respectively, or keep the logical states unchanged. Control circuit 140 provides ComH and ComL when testing is required. Control circuit 140 provides ComH or ComL at such potentials, that they can be modified by first logic 110 and second logic 120, respectively. That will be referred to by the term "select a logic". When testing is not required, control circuit 140 pulls lines 116 and 126 to such voltages that logic 110 and 120 do not consume power ("not select"). This can be accomplished by for example, pulling lines 116 and 126 to certain reference voltages or making lines 116, 126 with ComH, ComL floating. This is an advantage of the invention. When circuit 100 is tested in the manufacturing process, first logic 110 and second logic 120 are selected. During normal operation of circuit 100 after successful testing, first and second logic 110, 120 are simply disabled and do not consume power.

For further explanation, a first logical state of signals is abbreviated as logical "1" and a second logical state is abbreviated as logical "0". This assumptions are convenient for explanation, but not essential for the present invention.

For explaining the method for testing according to the present invention it is convenient to use the term 'pattern'. Patterns are defined for properly operating cells:

(1) A first pattern is a combination of N first signals $In_i$ such that, for normal operation, all second signals $S_i$ ($i=1$ to N) go to logical "1". First signals $In_i$ are applied simultaneously and can be at logical "1" or at logical "0" depending on the function of the individual cells $130_i$, and can be represented by first level 71 or by second level 72.

(2) A second pattern is a combination of N first signals $In_i$ such that, for normal operation, all second signals $S_i$ ($i=1$ to N) go to logical "0". First signals $In_i$ are applied simultaneously and can be at logical "1" or at logical "0" depending on the function of the individual cells $130_i$, and can be represented by first level 71 or by second level 72.

When both patterns have been applied to cells $130_i$, cells $130_i$ have received $In_i$ at first level 71 and at second level 72. The order is not important, cells $130_i$ can receive level 71 at first and after that level 72 or vice versa. Preferably, first and second patterns have complimentary logical states. Persons of skill in the art will be able to provide first and second patterns. For example, a first pattern can be formed by first signals $In_i$ which are all at logical "1" and represented by first threshold 81. In that case, a second pattern is formed by first signals $In_i$ which are all at logical "0" and represented by second threshold 82.

Figure 3:
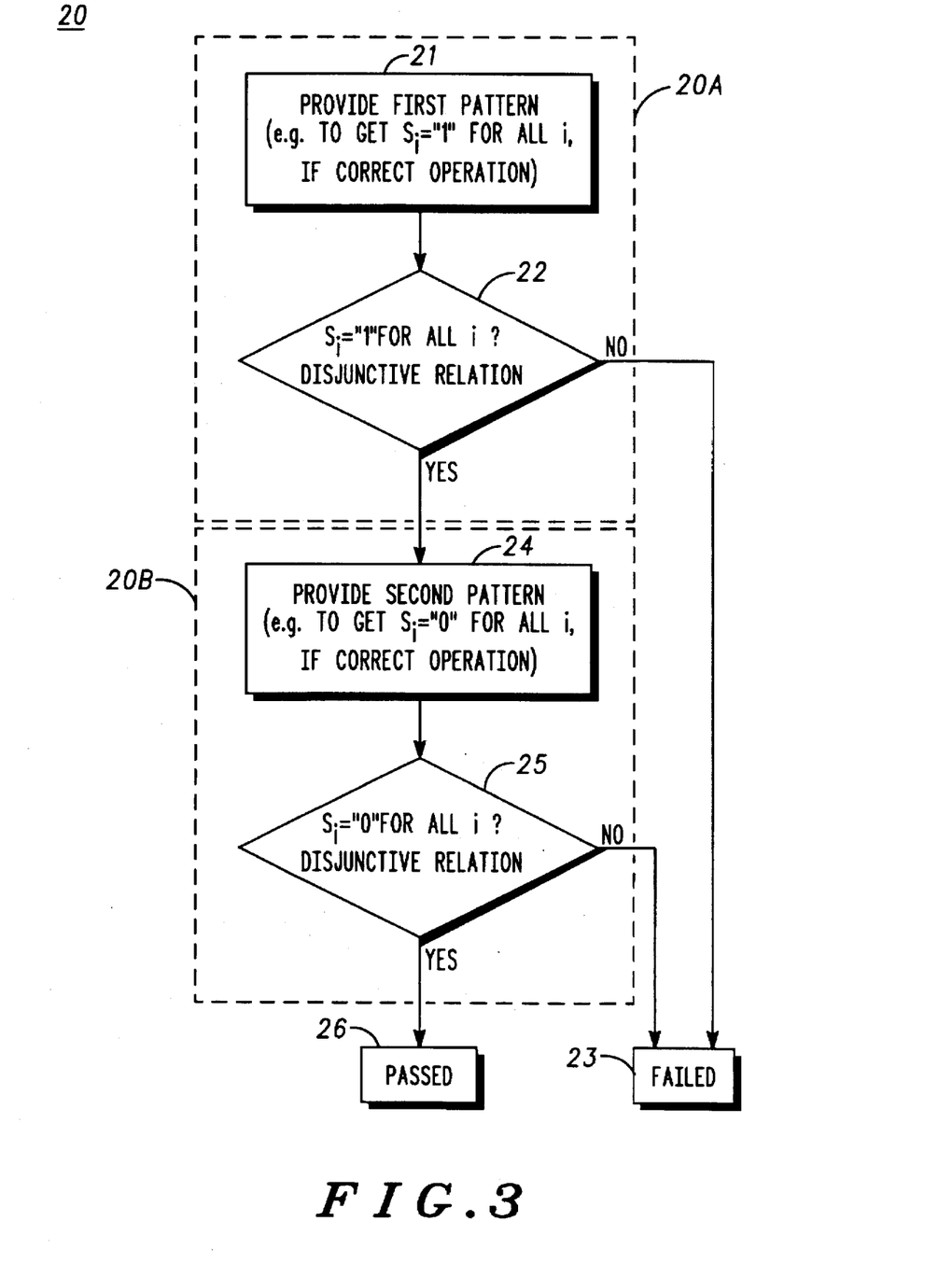
FIG. 3 is a simplified flow chart diagram of the test method according to the invention.

FIG. 3 is a simplified flow chart diagram of test method 20 (also, test 20 and 'method for testing') according to the invention. Blocks 21, 22, 24, 25 illustrate test steps. Block 23 and 26 illustrate test results PASSED or FAILED. Test 20 is positive (PASSED) when cells $130_i$ ($i=1$ to N) properly operate and negative (FAILED) when at least one cell $130_k$ does not operate properly. Test method 20 of the invention comprises first test 20A and second test 20B shown dashed. First test 20A and second test 20B can be performed in either order. It is possible to abort testing and abort test method 20 as soon as test 20A or 20B results in FAILED.

First test 20A comprises steps 21 and 22. In step 21, a first pattern (e.g., all $In_i$="1" at threshold 81) is supplied to cells $130_i$. Second signals $S_i$ are generated. For properly operating cells $130_i$, all second signals $S_i$ are at logical "1". Otherwise, if at least one cell $130_k$ does not operate properly, its second signal $S_k$ is at logical "0". In step 22, first logic 110 receives ComH="0" and second signals $S_i$. In first logic 110, second signals $S_i$ are disjunctive related. Signal ComH is modified as:

$$ComH=\underline{S_1} \ldots OR\ \underline{S_i}\ OR \ldots OR\ \underline{S_N}, \quad (3)$$

where the underscore of 'S' indicates logical negation. ComH="1" indicates test result FAIL (block 23) so that test 20 can be aborted. In that case, ComH is alternated (toggled). When all second signals $S_i$ are equal (e.g., $S_i$=0), then ComH remains at "0" and test 20 is continued (block 24). It is convenient to communicate the test result through control circuit 140 and third control signal 143 (FIG. 2). It is convenient that during first test 20A, second logic 120 is not selected and does not modify ComL. This is an advantage of the invention. As it will be shown in connection with the first embodiment, second logic 120 does not consume power.

Second test 20B comprises steps 24 and 25. In step 24, a second pattern (e.g., all $In_i$="0" at threshold 82) is supplied to cells $130_i$. For properly operating cells $130_i$ of circuit 100, all second signals $S_i$ are at logical "0". Otherwise, at least one second signal $S_k$ is at logical "1". In step 25, second logic 120 receives ComL="1" and second signals $S_i$. In second logic 120, second signals $S_i$ are related and ComL is modified as:

$$ComL=NEG(S_1 \ldots OR\ S_i\ OR \ldots OR\ S_N), \quad (4)$$

where NEG indicates logical negation.

During second test 20B, first logic 110 is, preferably, not selected and does not consume power. ComL="0" indicates test result FAILED (block 23). ComL="1" indicates the test result PASSED (block 24).

In other words, when in test 20A, ComH toggles (from "0" to "1") or when in test 20B ComL toggles (from "1" to "0") than the presence of at least one malfunctioning cell $130_k$ is detected. Test results FAILED or PASSED are communicated through control circuit 140 to control interface 101 or to other elements of circuit 100. A further advantage of the invention is that all inputs $130_i$ are tested simultaneously, thus total testing time is limited to first test 20A and second test 20B.

As a person of skill in the art will understand, the application of test method 20 is not limited to manufacturing. Test method 20 can also be applied in circuits 100 which are already in use. As in an non-limiting example, test method 20 can be periodically performed every time when circuit 100 is switched on.

A preferred embodiment of the invention will be described in connection with FIGS. 4–6. As an example and not intended to be limiting, this embodiment was implemented in CMOS-technology using P-channel and N-channel field effect transistors (P-FETs, N-FETs). The FETs have a control electrode (gate G), a first current electrode (drain D) and a second current electrode (source S). Since a FET is typically a symmetrical device, the true designation of "source" and "drain" is only possible once a voltage is impressed on the terminals. The designations of source and drain herein should be interpreted, therefore, in the broadest sense. The term 'FET' is intended to include other devices having current and control electrodes, such as for example, bipolar devices.

The terms 'first type' and 'second type' are intended to distinguish complementary transistors of opposite conductivity. Preferably, transistors of the first type are P-FETs and transistors of the second type are N-FETs. This is convenient, but not essential for the present invention. Other configurations and manufacturing technologies can also be used, as will be understood by persons skilled in the art. Preferably, the substrates of the FETs are coupled to a first or second reference terminal. For clarity, the substrates are not shown on the simplified schematic diagrams which will be explained below. Supply voltages are VDD and VSS which are, for example, VDD=5 volts and VSS=0 volts. It is assumed that VDD and VSS are representative for logical "1" and "0", respectively. N-FETs are conductive when the gate receives a signal at logical "1" and nonconductive for logical "0". P-FETs are conductive for "0" and nonconductive for "1". Reference voltages VDD and VSS are, for example, 5 volts and 0 volts, respectively.

Figure 4:
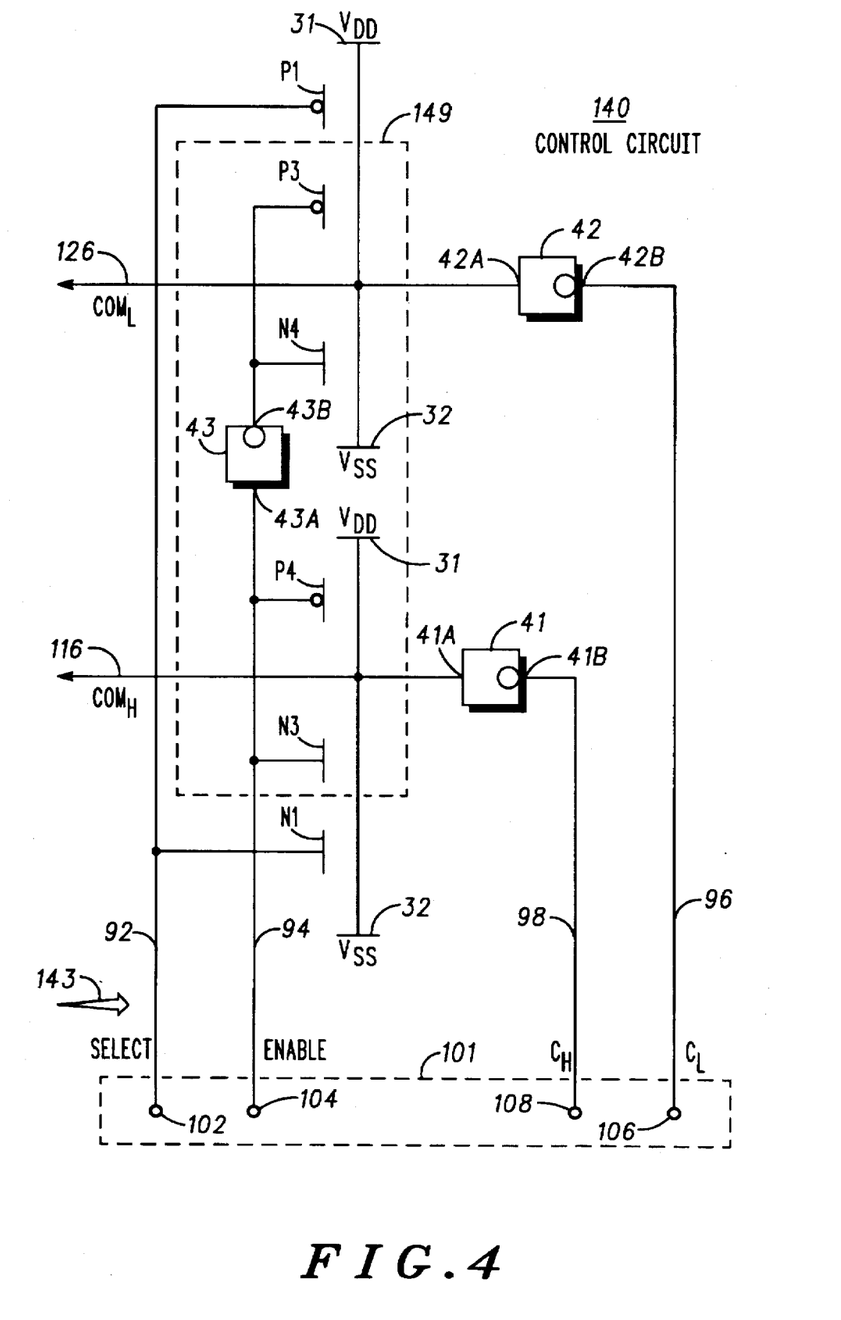
FIG. 4 shows a control circuit.

FIG. 4 is a simplified circuit diagram of control circuit 140 used in circuit 100. Control circuit 140 comprises first inverter 41, second inverter 42, third inverter 43, first N-FET N1, third N-FET N3, fourth N-FET N4, first P-FET P1, third P-FET P3, and fourth P-FET P4. The terms 'second P- and N-FET' are reserved for transistors in logic 110 and 120 which will be explained in FIGS. 5–6. Control circuit 140 has first reference terminal 31 at voltage VDD and second reference terminal 32 at voltage VSS. Control circuit 140 provides ComH at line 116 and ComL at line 126. Further, control circuit 140 has input 102 for receiving level select signal 92 (hereinafter SELECT) and input 104 for receiving test enable signal 94 (hereinafter ENABLE). Output 108 provides first result signal 98 (hereinafter $C_H$) and output 106 provides second result signal 96 (hereinafter $C_L$). Inputs 102 and 104 and outputs 106 and 108 correspond to control interface 101 of FIG. 2 (dashed frame in FIG. 4). Signals SELECT, ENABLE, $C_H$, and $C_L$ are collectively referred to as third control signal 143 (FIG. 2).

P-FETs P1 and P3 and N-FET N4 as well as P-FET P4 and N-FETs N3 and N1 are serially arranged with their S-D and D-S-paths between first reference terminal 31 and second reference terminal 32. The source of fourth P-FET P4 is coupled to first reference terminal 31. The drains of fourth P-FET P4 and third N-FET N3 are coupled together to line 116 and to input 41A of first inverter 41. The source of third N-FET N3 is coupled to the drain of first N-FET N1. The source of first N-FET N1 is coupled to second reference terminal 32. The source of first P-FET P1 is coupled to first reference terminal 31. The drain of first P-FET P1 is coupled to the source of third P-FET P3. The drains of third P-FET P3 and fourth N-FET N4 are coupled together to second line 126 and to input 42A of second inverter 42. The source of fourth N-FET N4 is coupled to second reference terminal 32. Input 102 is coupled to the gates of first P-FET P1 and first N-FET N1. Input 104 is coupled to the gates of third N-FET N3 and fourth P-FET P4 and to input 43A of third inverter 43. Output 43B of third inverter 43 is coupled to the gates of fourth N-FET N4 and third P-FET P3. Output 41B of first inverter 41 is coupled to output 108 and output 42B of second inverter 42 is coupled to output 106.

In control circuit 140, first P-FET P1 and first N-FET N1 have the function of a pull-up device and a of a pull-down device, respectively. The terms 'up' and 'down' are convenient abbreviations to indicate directions shown on the paper. When SELECT is at logical "1", the pull-down device (N-FET N1) provides ComH at logical "0". ComL is floating. First logic 110 is selected and second logic 120 is not selected. First test 20A (FIG. 3) can be performed. When SELECT is at logical "0", the pull-up device (first P-FET P1) provides ComL at logical "1". ComH is floating. Second logic 120 is selected and first logic 110 is not selected. Second test 20B (FIG. 3) can be performed. The alternative selection of first logic 110 and second logic 120 is a distinctive feature of the invention and saves current flow during testing.

As it will be explained in detail in connection with FIG. 5, selected first logic 110 can pull first ComH to logical "1". Signal ComH stays at logical "0" when all cells 130 operate properly. The test result for first test 20A (FIG. 3) is transmitted to output 108 via first inverter 41. Inverter 41 provides first result signal $C_H$. When first logic 110 pulls ComH to logical "1", it overrides N-FET N1. As it will be explained in detail in connection with FIG. 6, selected second logic 120 can pull ComL to logical "0". Signal ComL stays at logical "1" when all cells 130 operate properly. The test result for second test 20B (FIG. 3) is transmitted to output 106 via second inverter 42. Inverter 42 provides second result signal $C_L$. When second logic 120 pulls ComL to logical "0", it overrides P-FET P1.

First inverter 41 and second inverter 42 are primarily provided to de-couple circuitry connected to outputs 108 and 106 from test circuit 160. The distinction of first result signal $C_H$ and second result signal $C_L$ is convenient but not essential. Further, in control circuit 140, third inverter 43, N-FETs N3 and N4 and P-FETs P3 and P4 are optional and form enable circuit 149 (dashed). Enable circuit 149 is controlled by test enable signal ENABLE. When testing is required, then ENABLE is at logical "1", therefore N-FET N3 and P-FET P3 are conductive. For further explaining test method 20, in this description in reference to the preferred embodiment, it is assumed that ENABLE is at logical "1". When testing is not required, then ENABLE is set to logical "0". Nonconducting N-FET N3 prevents serially coupled N-FET N1 from pulling ComH to logical "0". Nonconducting P-FET P3 prevents P-FET P1 from pulling ComL to logical "1". Conducting P-FET P4 pulls ComH to logical "1" and de-selects first logic 110. Conducting N-FET N4 pulls ComL to logical "0" and de-selects thereby second logic 120.

Figure 5:
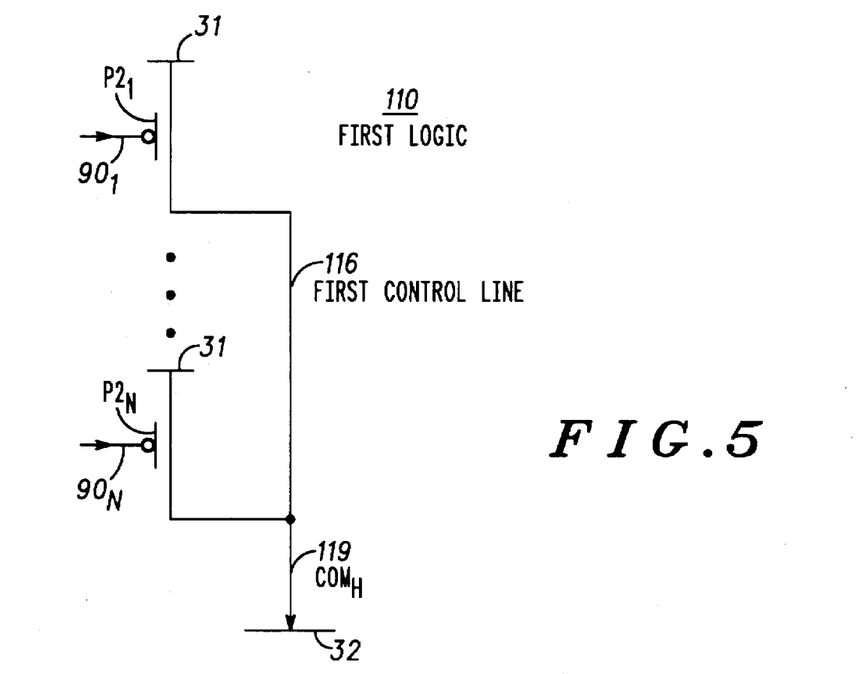
FIG. 5 shows a first logic.

FIG. 5 is a simplified circuit diagram of first logic 110 of circuit 100. First logic 110 comprises a plurality of N P-FETs $P2_i$. Preferably, P-FETs $P2_i$ have a higher transconductance than first N-FET N1 of control circuit 140 (FIG. 4) to override N-FET N1. This can be accomplished in several ways which are known to a person of skill in the art. The gates of P-FETS $P2_i$ receive second signals $S_i$ ($90_i$). The drains of P-FETs $P2_i$ are coupled to first line 116. Line 116 carries ComH. The sources of P-FETs $P2_i$ are coupled to first reference terminal 31 at voltage VDD ("1"). In FIG. 5, first logic 110 is shown selected with line 116 being pulled down to second reference terminal 32 at logical "0". When first logic 110 is selected, then any second signal $S_k$="0" can pull line 116 to first reference terminal 31 so that ComH changes to logical "1". When first logic 110 is not selected than line 116 is either floating or pulled to first reference terminal 31. In that case, a current can not flow through P-FETs $P2_i$ even if a gate receives an second signal at logical "1".

Figure 6:
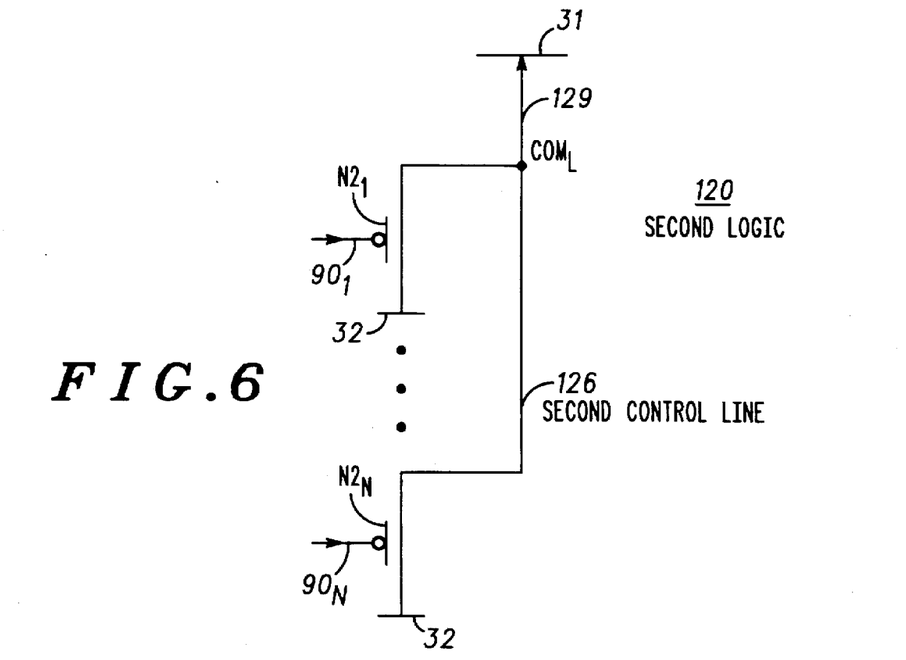
FIG. 6 shows a second logic.

FIG. 6 is a simplified circuit diagram of second logic 120 of circuit 100. Second logic 120 comprises a plurality of N second N-FETs $N2_i$. Preferably, N-FETs $N2_i$ have a higher transconductance than P-FET P1 of control circuit 140 (FIG. 4) to override P-FET P1. The gates of N-FETs $N2_i$ receive second signals $S_i$ ($90_i$). The drains of N-FETs $N2_i$ are coupled to second line 126. Line 126 carries ComL. The sources of N-FETs $N2_i$ are coupled to second reference terminal 32 at voltage VSS ("0"). In FIG. 6, second logic 120 is shown selected with line 126 being pulled down to first reference terminal 31 ("1"). When second logic 120 is selected, then any second signal $S_k$="1" can pull line 126 to second reference terminal 32 so that ComL changes to logical "0". When second logic 120 is not selected than line 126 is either floating or pulled to second reference terminal 32. In that case, a current can not flow through N-FETs N2$_i$ even if a gate receives an second signal at logical "1".

The function of test circuit 160 of the preferred embodiments now explained. Control circuit 140 receives SELECT at logical "1" and ENABLE at "1". First assuming that cells 130 of circuit 100 operate properly. In first test 20A (FIG. 3), a first pattern In$_i$ (for i=1 to N) is applied to circuit 100 such, that all second signals S$_i$ (for i=1 to N) are at logical "1". N-FETs N1 and N3 pull line 116 to second reference terminal 32 and ComH assumes logical "0". First logic 110 is selected. Signal ComL at second logic 120 is floating. With all second P-FETs P2$_i$ in first logic 110 receiving second signals S$_i$ at logical "1", P-FETs P2$_i$ are non conductive. Signal ComH stays at logical "0". This means a positive test result (PASSED) which is communicated trough first inverter 41 to output 108 as first result signal C$_H$.

In second test 20B (FIG. 3), a second pattern In$_i$ (i=1 to N) is applied such that all second signals S$_i$ (i=1 to N) are at logical "0". First P-FET P1 and third P-FET P3 pull ComL to first reference terminal 31 at logical "1". Second logic 120 is thereby selected. ComH is floating. Second N-FETs N2$_i$ receive second signals S$_i$="0" and stay non conductive. Second inverter 42 receives ComL="1" and provides second result signal C$_L$="0" signifying a positive test result (PASSED).

Now, improper operation of, for example, cell 130$_x$ and cell 130$_y$ is assumed. Cell 130$_x$ does not operate properly when it receives In$_x$ at logical "1" and cell 130$_y$ does not operate properly for In$_y$ at logical "0". In first test 20A (FIG. 3), cells 130$_i$ receive first signals In$_i$ at logical "1". Cell 130$_x$ provides second signal S$_x$ at logical "0" and the other cells 130$_i$ (without x) provide logical "0". First N-FET N1 can not support ComH="0" at first line 116 because second P-FET P2$_x$ receiving S$_x$="0" pulls ComH to logical "1". The detected error (FAILED) is communicated by first result signal C$_H$ to output 108. As first test 20A failed, test 20 can be aborted. For explanation, a continuation of test 20 is assumed. In second test 20B (FIG. 3), first signals In$_i$ are at logical "0". Defective cell 130$_y$ provides S$_y$="1" instead of S$_y$="0". Second N-FET N2$_y$ pulls second line 126 to logical "0" and overrides first P-FET P1. This detected error (FAILED) is communicated to output 106 as second control signal C$_L$.

It is an advantage of the present invention, that test circuit 160 can be integrated with core 150 into a single integrated circuit. The present invention provides short testing time for routine tests. Test patterns which have, preferably, first signals at equal level (e.g., at thresholds 81, 82) can be provided without considering the function of core 150. Preferably, test patterns do not depend on core 150, so that test set up times can be minimized. A person of skill in the art will be able reduce the number of inputs and outputs of control interface 101 (e.g., inputs 102, 104, outputs 106 108 in FIG. 4) for example by multiplexing signals SELECT, ENABLE, C$_H$, and C$_L$. Cells 130$_i$ can also have the function of transferring signals in opposite direction.

In the foregoing detailed description of the preferred embodiment, reference was made to the accompanying drawings which form a part hereof, and in which were shown by way of illustration a specific embodiment in which the invention may be practiced. These embodiment has been described in sufficient detail to enable those skilled in the art to practice the invention, and it is to be understood that other embodiments may be utilized and that logical, mechanical and electrical changes may be made without departing from the spirit and scope of the present invention. The foregoing detailed description is, therefore, not to be taken in a limiting sense, and the scope of the present inventions is defined only by the appended claims.

We claim:

1. A circuit having a plurality of input cells and a test circuit for testing the proper operation of said input cells, said circuit characterized in that said input cells receive during testing of said circuit consecutively a first pattern and a second pattern of first signals, said pattern providing that said input cells receive first signals at a first threshold and at a second threshold, whereby properly operating input cells provide a plurality of second signals having equal logical states with one of said patterns being applied;

in said test circuit, a control circuit consecutively provides a first control signal to a first logic and a second control signal to a second logic; and said plurality of said second signals is related by said first logic and by said second logic and that any second signal originating from a non-properly operating input cell changes said first control signal or said second control signal so that a circuit having at least one non-properly operating input cell is detected.

2. The circuit as described in claim 1, wherein said control circuit provides said first control signal and said second control signal only during testing, otherwise makes said first control signal and said second control signal floating, so that said first logic and said second logic consume power only during testing.

3. The circuit as described in claim 1, said control circuit having a first reference terminal and a second reference terminal, said control circuit comprising a first transistor of a first type and a first transistor of a second type, each transistor having a first current electrode, a second current electrode, and a control electrode, said first transistor of said second type having its first current electrode coupled to a first line and its second current electrode coupled to said second reference terminal, and its control electrode receiving a level select signal, said first transistor of said first type having its first current electrode coupled to a second line, its second current electrode to said first reference line, and its control electrode receiving said level select signal, said control circuit in response to said level select signal alternatively pulling said second line to said first reference terminal and providing thereby said second control signal at a first logical state and pulling said first line to said second reference terminal and providing thereby said first control signal at a second logical state.

4. The circuit as described in claim 1 further comprising a first transistor and a third transistor of a first type and a first transistor and a third transistor of a second type, said transistors having a first current electrode, a second current electrode, and a control electrode, said transistors of said first type being serially coupled with its first and second current electrodes between a second line and a first reference terminal, said transistors of said second type being serially coupled with its first and second current electrodes between a first line and a second reference terminal, said third transistors being simultaneously conductive or simultaneously non-conductive in response to a test enable signal supplied to their control electrodes, said first transistors receiving a level select signal at their control electrodes, for alternatively pulling said second line or said first line to said second reference terminal or to said first reference terminal, respectively, and providing thereby said second control signal or said first control signal, respectively.

5. The circuit as described in claim 1 further comprising a fourth transistor of a first type and a fourth transistor of a second type, said transistors having a first current electrode, a second current electrode, and a control electrode, said fourth transistor of said first type being coupled with its first and second current electrodes between a first line and a first reference terminal, said fourth transistor of said second type being coupled with its first and second current electrodes between a second line and a second reference terminal, wherein at times when testing is not required, said fourth transistors pull said first and second lines to said first reference terminal or to said second reference terminal in response to a test enable signal supplied to their control electrodes.

6. A circuit having a core, a plurality of input cells and a test circuit for testing the proper operation of said input cells, said test circuit of said circuit comprising:

a first reference terminal and a second reference terminal;

a first transistor of a first type, a first transistor of a second type, a plurality of second transistors of said first type, a plurality of second transistors of said second type, each transistor having a first current electrode, a second current electrode, and a control electrode, said first transistor of said second type having its second current electrode coupled to said second reference terminal, its first current electrode coupled to the first current electrodes of said second transistors of said first type at a first line, said first transistor of said first type having its second current electrode coupled to said first reference terminal, its first current electrode coupled to the first current electrodes of said second transistors of said second type at a second line, said second transistors of said first type having their second current electrodes coupled to said second reference terminal, said second transistors of said second type having their second current electrodes coupled to said first reference terminal, said second transistors having their control electrodes coupled to said input cells, said first transistors receiving at their control electrodes a level select signal, wherein depending on said level select signal said first line is pulled to said second reference terminal by said first transistor of said second type or said second line is pulled to said first reference terminal by said first transistor of said first type, and wherein any not properly operating input cell causes any of said second transistors to pull said lines to the opposite reference terminal.

7. The circuit as described in claim 6 further comprising a third transistor of said first type, a third transistor of said second type, a fourth transistor of said first type, and a fourth transistor of said second type, each transistors having a first current electrode, a second current electrode, and a control electrode, said third transistor of said first type having its first and second current electrodes serially coupled to said first and second current electrodes of said first transistor of said first type, said third transistor of said second type having its first and second current electrodes serially coupled to said first and second current electrodes of said first transistor of said second type, said fourth transistor of said first type having its first current electrode coupled to said first line and said second current electrode coupled to said first reference terminal, said fourth transistor of said second type having its first current electrode coupled to said second line and said second current electrode coupled to said second reference terminal, said control electrodes of said third transistor of said second type and of said fourth transistor of said first type receiving a test enable signal, said control electrodes of said third transistor of said first type and of said fourth transistor of said second type receiving said test enable signal 94 in an inverted form.

8. The circuit as described in claim 6 wherein said transistors of said first type are implemented by P-channel field effect transistors and said transistors of said second type are implemented by N-channel field effect transistors.

9. The circuit as described in claim 6 further comprising a third transistor of said first type, a third transistor of said second type, a fourth transistor of said first type, and a fourth transistor of said second type, each transistors having a first current electrode, a second current electrode, and a control electrode, said transistors of said first type being implemented by P-channel field effect transistors and said transistors of said second type being implemented by N-channel field effect transistors, said third transistor of said first type having its first and second current electrodes serially coupled to said first and second current electrodes of said first transistor of said first type, said third transistor of said second type having its first and second current electrodes serially coupled to said first and second current electrodes of said first transistor of said second type, said fourth transistor of said first type having its first current electrode coupled to said first line and said second current electrode coupled to said first reference terminal, said fourth transistor of said second type having its first current electrode coupled to said second line and said second current electrode coupled to said second reference terminal.

10. The circuit as described in claim 6 further comprising a third transistor of said first type and a third transistor of said second type, each transistors having a first current electrode, a second current electrode, and a control electrode, said third transistor of said first type having its first and second current electrodes serially coupled to said first and second current electrodes of said first transistor of said first type, said third transistor of said second type having its first and second current electrodes serially coupled to said first and second current electrodes of said first transistor of said second type, said control electrodes of said third transistor of said second type receiving a test enable signal, said control electrodes of said third transistor of said first type receiving said test enable signal 94 in an inverted form.

11. The circuit as described in claim 6 further comprising a fourth transistor of said first type and a fourth transistor of said second type, each transistors having a first current electrode, a second current electrode, and a control electrode, said fourth transistor of said first type having its first current electrode coupled to said first line and said second current electrode coupled to said first reference terminal, said fourth transistor of said second type having its first current electrode coupled to said second line and said second current electrode coupled to said second reference terminal, said control electrodes of said fourth transistor of said first type receiving a test enable signal, said control electrodes of said fourth transistor of said second type receiving said test enable signal 94 in an inverted form.

12. A method for testing if a plurality of input cells of a circuit correctly transfers first signals at first levels and second levels to second signals, said method comprising in either order the steps of:

applying a first pattern to said input cells, said first pattern having first signals at either of said first levels or said second levels, and providing a first control signal to a first logic, said first logic monitoring said second signals from said input cells, wherein any second signal from a not properly operating input cell toggles said first control signal; and applying a second pattern to said input cells, said second pattern having first signals at opposite levels as applied in the applying a first pattern step, and providing a second control signal to a second logic which monitors said second signals from said input cells, any second signals from a not properly operating input cell toggles said second control signal, thereby providing a positive test result when both control signals remain un-toggled or providing a negative test result when at least one of said control signals toggles.

13. The method for testing as described in claim 12 wherein said first signals at said first level are at a first threshold of said first level and wherein said first signals at said second level are at a second threshold of said second level.

14. The method for testing as described in claim 13 wherein a first P-channel field transistor pulls a first line to a first reference terminal and wherein alternatively a first N-channel field effect transistor pulls a second line to a second reference terminal, and wherein said second signals control a plurality of second N-channel field effect transistors parallel coupled between said first line and said second reference terminal and a plurality of second P-channel field effect transistors parallel coupled between said second line and said first reference terminal, wherein said second transistors have a higher transconductance than said first transistors so that any second signal from a malfunctioning input cell causes that said first line is pulled to said second reference terminal or that said second line is pulled to said first reference terminal.

15. The method for testing as described in claim 12 wherein said first signals at said first level have a voltage of substantially 2 volts and said first signals at said second level have a voltage of substantially 0.8 volts.

16. The method for testing as described in claim 12 wherein said first signals at said first level and at said second level have substantially voltages at the edges of a non-allowed third level.

17. The method for testing as described in claim 12 wherein said first control signal is provided by a first transistor of a first type which pulls a first line to a first reference terminal, wherein said first logic is formed by parallel coupled second transistors of a second type which are controlled by said second signals, wherein said second control signal is provided by a first transistor of said second type which pulls a second line to a second reference terminal and wherein said second logic is formed by parallel coupled second transistors of said first type.

* * * * *